US00RE40423E

(19) United States
(12) Reissued Patent
Nance et al.

(10) Patent Number: US RE40,423 E
(45) Date of Reissued Patent: Jul. 8, 2008

(54) MULTIPORT RAM WITH PROGRAMMABLE DATA PORT CONFIGURATION

(75) Inventors: Scott S. Nance, Sunnyvale, CA (US); Douglas P. Sheppard, Southlake, TX (US); Nicholas J. Sawyer, London (GB)

(73) Assignee: Xilinx, Inc., San Jose, CA (US)

(21) Appl. No.: 09/858,635
(22) Filed: May 15, 2001

Related U.S. Patent Documents

Reissue of:
(64) Patent No.: 5,715,197
Issued: Feb. 3, 1998
Appl. No.: 08/687,902
Filed: Jul. 29, 1996

(51) Int. Cl.
*G11C 16/04* (2006.01)

(52) U.S. Cl. ..... 365/189.02; 365/189.04; 365/230.05

(58) Field of Classification Search ..... 365/189.02, 365/189.04, 230.05
See application file for complete search history.

(56) References Cited

U.S. PATENT DOCUMENTS

| | | | |
|---|---|---|---|
| 3,473,160 | A | 10/1969 | Wahlstrom |
| 4,394,753 | A | 7/1983 | Penzel |
| 4,523,276 | A | 6/1985 | Maejima et al. |

(Continued)

FOREIGN PATENT DOCUMENTS

| | | | |
|---|---|---|---|
| EP | 0 156 316 | B1 | 3/1985 |
| EP | 0 306 726 | A2 | 8/1988 |
| EP | 0 509 135 | A1 | 9/1991 |
| EP | 0 780 846 | A2 | 6/1997 |
| JP | S58-188392 | | 12/1983 |
| JP | S59-180466 | | 8/1984 |
| JP | S63-134685 | | 5/1988 |
| JP | H2-199666 | | 7/1990 |
| JP | H4-74977 | | 3/1992 |
| WO | WO 95/16993 | | 6/1995 |
| WO | WO 97/17705 | | 5/1997 |
| WO | PCT/US97/10446 | | 9/1997 |

OTHER PUBLICATIONS

Ngai, Tony, "An SRAM–Programmable Field–Configurable Memory", Thesis, 1994, pp. 1–82, available from ProQuest Co., 300 North Zeeb Raod, P.O. Box 1346, Ann Arbor, Michigan, 48106–1346.

Ngai, Tony, et al., "An SRAM–Programmable Field–Configurable Memory", 1995, pp. 499–502, Proceeding of the IEEE 1995 Custom Integrated Circuits Conference, available from Available from IEEE, 3 Park Avenue, New York, NY 10016–5997.

(Continued)

*Primary Examiner*—Tuan T. Nguyen
(74) *Attorney, Agent, or Firm*—Jeanette Harms

(57) ABSTRACT

A RAM with programmable data port configuration provides for programmable configuration of RAM data ports, and in the case of a multiport RAM, for independent programmable configuration of each data port. A single programmable RAM cell can be utilized in a variety of data port configurations, thereby reducing the number of combinations necessary in a standard cell library or gate array in implement the every possible configuration. In one embodiment of the invention, a dual port RAM is provided with a decoder, an input multiplexer and an output multiplexer for each data port. The input multiplexer for each data port provides several different selectable mappings of a RAM input word of varying sizes to the input bit lines of the respective data port. Similarly, the output multiplexer for each data port provides several different selectable mappings of the RAM output bit lines to the RAM output word. The decoder receives configuration programming bits to determine the appropriate size of the RAM input and output word for the respective port, and based on column addressing bits, outputs a select signal to select the appropriate mapping from the input and output multiplexers. Decoding circuitry is used during RAM write operations to disable those input bits not addressed.

18 Claims, 5 Drawing Sheets

U.S. PATENT DOCUMENTS

| | | | | |
|---|---|---|---|---|
| 4,593,373 | A | 6/1986 | Kiuchi et al. | |
| 4,609,986 | A | 9/1986 | Hartmann et al. | |
| 4,617,479 | A | 10/1986 | Hartmann et al. | |
| 4,633,441 | A | 12/1986 | Ishimoto | 365/189 |
| 4,642,487 | A | 2/1987 | Carter | |
| 4,654,781 | A | 3/1987 | Schwartz et al. | |
| 4,677,318 | A | 6/1987 | Veenstra | |
| 4,713,792 | A | 12/1987 | Hartmann et al. | |
| 4,751,671 | A | 6/1988 | Babetski et al. | |
| 4,758,745 | A | 7/1988 | Elgamal et al. | |
| 4,774,421 | A | 9/1988 | Hartmann et al. | |
| 4,796,232 | A | 1/1989 | House | |
| 4,799,053 | A | 1/1989 | Van Aken et al. | 340/703 |
| 4,807,189 | A | 2/1989 | Pinkham et al. | |
| 4,871,930 | A | 10/1989 | Wong et al. | |
| 4,899,067 | A | 2/1990 | So et al. | |
| 4,907,203 | A | 3/1990 | Wada et al. | |
| 4,912,342 | A | 3/1990 | Wong et al. | |
| 4,942,541 | A | 7/1990 | Hoel et al. | |
| 4,947,366 | A | 8/1990 | Johnson | |
| 4,963,770 | A | 10/1990 | Keida | |
| 4,975,601 | A | 12/1990 | Steele | |
| 4,985,867 | A | 1/1991 | Ishii et al. | |
| 4,987,319 | A | 1/1991 | Kawana | |
| 5,003,200 | A | 3/1991 | Sakamoto | |
| 5,027,326 | A | 6/1991 | Jones | |
| 5,029,141 | A | 7/1991 | Yoshimoto et al. | |
| 5,115,411 | A | 5/1992 | Kass et al. | |
| 5,117,388 | A | 5/1992 | Nakano et al. | 365/189.12 |
| 5,121,006 | A | 6/1992 | Pedersen | |
| 5,128,559 | A | 7/1992 | Steele | |
| 5,142,672 | A | 8/1992 | Johnson et al. | |
| 5,146,428 | A | 9/1992 | Tanimura | |
| 5,177,706 | A | 1/1993 | Shinohara et al. | |
| 5,195,056 | A | 3/1993 | Pinkham et al. | 365/189.05 |
| 5,220,214 | A | 6/1993 | Pedersen | |
| RE34,363 | E | 8/1993 | Freeman | |
| 5,237,701 | A | 8/1993 | Bertrand | |
| 4,617,479 | A | 9/1993 | Hartmann et al. | |
| 5,258,668 | A | 11/1993 | Cliff et al. | |
| 5,260,610 | A | 11/1993 | Pedersen et al. | |
| 5,260,611 | A | 11/1993 | Cliff et al. | |
| 5,274,581 | A | 12/1993 | Cliff et al. | |
| 5,280,456 | A | 1/1994 | Okajima et al. | |
| 5,333,294 | A | 7/1994 | Schnell | |
| 5,350,954 | A | 9/1994 | Patel | |
| 5,371,422 | A | 12/1994 | Patel et al. | |
| 5,396,608 | A | 3/1995 | Garde | |
| 5,404,474 | A | 4/1995 | Crook et al. | |
| 5,406,525 | A | 4/1995 | Nicholes | |
| 5,410,546 | A | 4/1995 | Boyer et al. | |
| 5,426,612 | A | 6/1995 | Ichige et al. | |
| 5,434,818 | A | 7/1995 | Byers et al. | |
| 5,504,875 | A | 4/1996 | Mills et al. | |
| 5,506,850 | A | 4/1996 | Osann, Jr. | |
| 5,541,530 | A | 7/1996 | Cliff et al. | |
| 5,543,732 | A | 8/1996 | McClintock et al. | |
| 5,550,782 | A | 8/1996 | Cliff et al. | |
| 5,559,450 | A | 9/1996 | Ngai et al. | |
| 5,566,123 | A | 10/1996 | Freidin et al. | |
| 5,592,106 | A | 1/1997 | Leong et al. | |
| 5,614,840 | A | 3/1997 | McClintock et al. | |
| 5,689,195 | A | 11/1997 | Cliff et al. | |
| 5,689,731 | A | 11/1997 | West et al. | |
| 5,715,197 | A * | 2/1998 | Nance et al. | 365/189.02 |
| 5,717,901 | A | 2/1998 | Sung et al. | |
| 5,867,422 | A | 2/1999 | John | |
| 5,933,023 | A | 8/1999 | Young | |
| 6,563,751 | B1 * | 5/2003 | Wu | 365/201 |

OTHER PUBLICATIONS

Matsumoto, Rodney T., "Configurablle On–Chip RAM Incorporated Into high Speed Logic Array", 1985, pp. 240–243, Custom Integrated Circuits Conference, available from IEEE, 3 Park Avenue, New York, NY 10016–5997.

Wilton, Steven J. E., et al., "Architecture of Centralized Field Configurable Memory", Proceeding of the Third Internation ACM Symposium on Field–Programmable Gate Arrays, 1995, pp. 1–7, available from Dept. of Electrical and Computer Engineering, University of Toronto, Toronto, Ontario, Canada M5S1A4.

Marple, David, et al., "An MPGA Compartible FPGA Architecture", IEEE Custom Integrated Circuits Conference, 1992, pp. 4.2.1–4.2.4, Available from IEEE, 3 Park Avenue, New York, NY 10016–5997.

Hsieh, Hung–Chung, et al., "Third Generation Architecture Boots Speed and Density of Field Programmable Gate Arrays", 1990 Custom Integrated Circuits Conference, pp. 31.2.1–31.2.7, available from Xilinx, Inc., 2100 Logic Drive, San Jose, CA 95124.

Britton, Barry K., et al., "Optimized Reconfigurable Cell Array Architecture for High–Performance Field–Programmable Gate Arrays", 1993 Custom Integrated Circuits Conference, pp. 7.2.1–7.2.5available from IEEE.

Smith, Daniel E., "Intel's FLEXlogic FPGA Architecture", 1993, pp. 378–384, Available from IEEE, 3 Park Avenue, New York, NY 10016–5997.

Motorola: Semiconductor Technical Data: Product Review; MCM101524D: "1M × Bit Fast Static Random Access memory with ECL I/O"; Rev. 2, Sep. 1994; Copyright Motorola 1994; pp. 1–8.

Tsukasa Ooishi et al.; Paper Special Issue on LSI Memories; "A ST (Stretchable Memory Matrix) DRAM with Multi–Valued Addressing Scheme"; IEICE Trans. Electron; vol. E75–C, No. 1I; Nov. 1992; pp. 1323–1332.

Koji Nii et al.; "A Multi–Port RAM Generator with Novel Memory Cell for CMOS Se–Of–Gates"; IEEE 1994 Custom Integrated Circuits; Conference; Copyright 1994 IEEE; pp. 667–670.

Alex, Yuen et al.; "A 32K ASIC Synchronous RAM Using a Two–Transistor Basic Cell"; Copyright 1989 IEEE; IEEE Journal of Solid–State Circuits; vol. 24, No. I; Feb. 1989; pp. 57–61.

Shinpei Kayano et al.; 25–ns 256K × 1/64 K + 4 CMOS SRAM's; Copyright 1986 IEEE; IEEE Journal of Solid–State Circuits; vol. SC–21, No. 5; Oct. 1986; pp. 686–691.

MicroDesign Resources, Inc.; "Cypress SPARC Chips Target Workstations"; Microprocessor Report; The Newsletter of Microprocessor–Based Design; vol. 2, No. 7; Copyright 1988 MicroDesign Resources Inc,; pp. 11–16.

Microprocessors and Microsystems; "MAP Family of Peripherals with User–Configurable Memory"; Application Note; vol. 13, No. 10; Dec. 1989; pp. 666–672.

M. Agarwala et al.; "An Architecture for a DSP Field–Programmable Gate Array"; Transactions Briefs; IEEE Transactions on Very Large Scale Integrated (VLSI) Systems; vol. 3, No. 1; Mar. 1995; Copyright 1995 IEEE; pp. 136–141.

Dave Bursky; "RAM–Based Logic Arrays Up Density, Cut Delays"; Electronic Design; Oct. 1, 1992; pp. 45–46 and 48–49.

Dave Bursky; "Gate Arrays Face Onslaught of Dense and Flexible FPGAs"; Electronic Design Report; Electronic Design; Jun. 26, 1995; pp. 85–88, 90, 94, and 96.

Satoru Isomura et al.; "Session 2: High–Speed SRAMs"; WAM 2.1: A 36kb/2ns RAM with 1kG/100ps Logic Gate Array"; copyright 1989 IEEE International Solid–State Circuits Conference; ISSCC 89/Wednesday, Feb. 15, 1989; pp. 26–27 and 278.
David Karchmer et al.; "Definition and Solution of the Memory Packing Problem for Field–Programmable Systems"; Copyright 1994 ACM; pp. 20–26.
David Karchmer; "A Field–Programmable System with Reconfigurable Memory"; Copyright by David Karchmer 1994; a Thesis; pp. 1–84.
Bob Kertis et al.; "A 6.8ns 1Mb ECL I/O BICMOS Configurable SRAM"; Copyright 1990 IEEE; 1990 Symposium on VLSI Circuits; pp. 39–40.
Levi R. Kimmel; "Dynamic Memory Output Reorganization"; IBM Technical Disclosure Bulletin; Dec. 1983; downloaded from https://www.delphion.com/tdbs/tdb?order=83A+62699; pp. 3244–3245.
Yoshio Kohno et al.; "A 14–ns 1–Mbit CMOS SRAM with Variable Bit Organization"; copyright 1988 IEEE; IEEE Journal of Solid–State Circuits; vol. 23, No. 5; Oct. 1988; pp. 1060–1066.
Sy–Yen Kuo et al.; "Efficient Reconfiguration Algorithms for Degradable VLSI/WSI Arrays"; Copyright 1992 IEEE; IEEE Transactions on Computer–Aided Design; vol. 11, No. 10; Oct. 1992; pp. 1289–1300.
Hsing–San Lee et al.; "Session XIII: Static RAMs: THPM 13.4: An Experimental 1Mb CMOS SRAM with Configurable Organization Operation"; ISSCC'88; pp. 1–3.
Ostapko Ling; "Utilizing Dynamic Chip Organization to Allow Both Strip and Rectangular Mapping to Memory"; IBM Technical Disclosure Bulletin: Dec. 1984; downloaded from https://www.delphion.com/cgi–bin/d2www.cmd/v4/tdb.d2w/tdb?order...; pp. 1–2.
Craig Lytle; "FLEX Programmable Logic: Largest Density PLD"; copyright 1993 IEEE; pp. 355–361.
David Marple et al.; "Programming Antifuses in Crosspoint's FPGA"; IEEE 1994 Custom Integrated Circuits Conference; Copyright 1994 IEEE; pp. 185–188.
Norio Miyahara et al.; "A composite CMOS Gate Array with 4K RAM and 128K ROM"; Copyright 1986 IEEE; IEEE Journal of Solid–State Circuits; vol. SC–21, No. 2; Apr. 1986; pp. 228–233.
Takashi Nishimura et al.; "0.6m 12K–Gate ECL Gate Array with RAM and ROM"; Copyright 1989 IEEE; IEEE 1989 Custom Integrated Circuits Conference; pp. 15.6.1–15.6.4.
Dave Pryce; "Specialized Memories Ease Communications"; Dual–Port Static RAMs; Technology Update; EDN Apr. 13, 1989; pp. 83–89.
Hisayasu Satoh et al.; "A 209K–Transistor ECL Gate Array with RAM"; Copyright 1989 IEEE; IEEE Journal of Solid–State Circuits; vol. 24, No. 5; Oct. 1989; pp. 1275–1279.
Hisayasu Satoh et al.; "Session 13: Gate Arrays, THPM 13.5: A 209K–Transistor ECL Gate Array with RAM"; Copyright 1989 IEEE; 1989 IEEE International Solid–State Circuits Conference; ISSCC 89; Feb. 16, 1989; pp. 184–186.
Alexander S. Shubat et al.; "A Family of User–Programmable Peripherals with a Functional Unit Architecture"; Copyright 1992 IEEE; IEEE Journal of Solid–State Circuits; vol. 27, No. 4; Apr. 1992; pp. 515–529.
Nobuo Tamba et al.; "A 1.5–ns 256–kb BiCMOS SRAM with 60–ps 11–K Logic Gates"; Copyright 1994 IEEE; IEEE Journal of Solid–State Circuits; vol. 29, No. 11; Nov. 1994; pp. 1344–1352.
Todd Williams et al.; "An Experimental 1–Mbit CMOS SRAM with Configurable Organization and Operation"; IEEE Journal of Solid–State Circuits; vol. 23, No. 5; Oct. 1988; pp. 1085–1094.
Jarvis C. Tuo et al., "A Submicrometer CMOS Embedded SRAM Compiler"; Special Brief Papers; Copyright 1992 IEEE; IEEE Journal of Solid–State Circuits; vol. 27, No. 3; Mar. 1992; pp. 417–424.
Thomas J. Tyson et al., "Using the 54/74LS610–13 Memory Mapping Units"; Application Note; Microprocessors and Microsystems; Copyright 1988; pp. 286–291.
VLSI Technology, Inc.; Preliminary VT16DP8; 1,024 × 16, 2,048 × 8 Dual–Port RAM; pp. 5–3 to 5–12.
Tomobisa Wada et al.; "Variable Bit Organization as a New Test Function for Standard Memories"; Brief Papers; Copyright 1991 IEEE; IEEE Journal of Solid–State Circuits; vol. 26, No. 1; Jan. 1991; pp. 51–54.
Sua C. Wong et al.; "A 5000–Gate CMOS EPLD with Multiple Logic and Interconnect Arrays"; Copyright 1989 IEEE; IEEE 1989 Custom Integerated Circuits Conference; pp. 5.8.1–5.8.4.
Minnick, R. C.; "A Survey of Microcellular Research", Journal of the Association for Computing Machinery, vol. 14, No. 2, Apr. 1967, pp. 203–241.
Wahlstrom, S. E.; "Programmable Logic Arrays—Cheaper by the Millions"; Electronics, Dec. 11, 1967; pp. 90–95.
Mukho–padhyay, A.; ed.; *Recent Developments in Switching Theory,* Academic Press, New York, 1971; Chapters VI "Universal Logic Modules" and IX "Programmable Cellular Logic", pp. 229–254 and 369–422.
El Gamel et al.; "An Architecture for Electrically Configurable Gate Arrays", IEEE Journal of Solid–State Circuits; vol. 24, No. 2, Apr. 1989; pp. 394–398.
El–Ayat et al.; "A CMOS Electrically Configurable Gate Array"; IEEE Journal of Solid–State Circuits; vol. 24, No. 3; Jun. 1989; pp. 752–762.
Xilinx, Inc.; "XC5000 Logic Cell Array Family Technical Data, Advance Information"; available from Xilinx, Inc. 2100 Logic Drive, San Jose, Ca 95124; Feb. 1995.
Nichols, John L.; "A Logical Next Step for Read–Only Memories"; Electronics; Jun. 12, 1967; pp. 111–113.
Kvamme, Floyd; "Standard Read–Only Memories Simply Complex Logic Design"; Electronics; Jan. 5, 1970; pp. 88–95.
Hemel, Albert; "Making Small ROM's [sic]D Math Quickly, Cheaply and Easily"; Electronics; May 11, 1970; pp. 104–111.
Fletcher, William I. et al.; "Simply Sequential Circuit Design"; Electronic Design; Jul. 8, 1971; pp. 70–72.
Sholl, Howard A. et al.; "Design of Asynchronous Sequential Networks Using Read–Only Memories"; IEEE Tranactions on Computer; vol. C–24, No. 2; Feb. 1975; pp. 195–206.
Weinberger, Arnold; "High–Speed Programmable Logic Array Adders"; IBM J. Res. Develop.; vol. 23, No. 2; Mar. 1979; pp. 163–178.
Kambayashi, Yahiko; "Logic Design of Programmable Logic Arrays"; IEEE Tranactions on Computers; vol. C–28, No. 9, Sep. 1979; pp. 609–617.
Xilinx, Inc.; "The Programmable Logic Data Book"; 1996; available from Xilinx, Inc. 2100 Logic Drive, San Jose, CA 95124; pp. 4–5 to 4–20.

* cited by examiner

| ROW ADDRESS | $A_1,A_2,A_3$ | B3 | B2 | B1 | B0 |
|---|---|---|---|---|---|
| 0 | 000 | MSB | | | LSB |
| 1 | 001 | (MSB) | (LSB) | (MSB) | (LSB) |
| 2 | 010 | | | | |
| 3 | 011 | | | | |
| 4 | 100 | | | | |
| 5 | 101 | | | | |
| 6 | 110 | | | | |
| 7 | 111 | | | | |
| COLUMN ADDRESS CA0,CA1 | | 11 | 10 | 01 | 00 |
| | | CA0=1 | | CA0=0 | |

(8 X 4) ADDRESSING = [ $A_1A_2A_3$]

(16 X 2) ADDRESSING = [ $A_1A_2A_3$CA0]

(32 X 1) ADDRESSING = [ $A_1A_2A_3$CA0CA1]

FIGURE 5

MULTIPORT RAM WITH PROGRAMMABLE DATA PORT CONFIGURATION

Matter enclosed in heavy brackets [ ] appears in the original patent but forms no part of this reissue specification; matter printed in italics indicates the additions made by reissue.

BACKGROUND OF THE INVENTION

1. Field of the Invention

This invention relates to the field of digital electronics, and more particularly to random access memory (RAM) data ports.

2. Description of the Related Art

In the prior art, data input/output (I/O) functions for memory cells in integrated circuits (ICs) have been confined to fixed-width word-length operations. For example, applications involving the use of an eight-bit data word utilize a memory cell having an eight-bit data port, and applications involving a sixteen-bit data word utilize a different memory cell with a hardwired sixteen-bit data port. This specificity of memory cells based on word length prevents the widespread application and re-use of general memory configurations.

In the construction of electronic circuits, many skilled practitioners use what are referred to as "standard cells" to build their circuits. These standard cells are predesigned circuit building blocks resident in a library of such building blocks. Because the standard cells are individually designed and tested before they are added to the library, performance characteristics for the standard cells are predictable. Using predesigned standard cells can reduce the amount of time between conception of a circuit design and production of a working circuit prototype.

Similarly, many designers use programmable gate arrays (PGAs) to implement digital circuit designs. Gate arrays are integrated circuits with standard logic cells (e.g., NAND gates, NOR gates, registers, etc.) already resident in an integrated circuit. Typically, gate array ICs include thousands of these individual cells with mechanisms for interconnecting the cells. The designer merely identifies the interconnection of the resident logic cells to implement his circuit design. The mechanism for interconnecting the cells may be a one-time fuse mechanism, or a programmable mechanism allowing for reuse of the gate array IC in another design.

For instance, using a field-programmable gate array (FPGA), such as one from the XILINX product line, an erasable programmable ROM chip (EPROM) or electrically erasable programmable ROM chip (EEPROM) may be used to store the programmable configuration information for one or more PGAs. To implement a new logic design on the same PGAs, the designer erases the EPROM and loads in a new set of configuration information. During the startup cycle, the PGAs adopt the new configuration by interconnecting the logic cells based on the new configuration information. Using computer aided design (CAD) tools to generate the configuration information, a recursive design process can cycle from one working design implementation to a revised working design implementation in as little time as a single day.

One drawback of gate arrays is that the number of logic cells of any particular type (e.g., NAND gate, eight-bit shift register, etc.) is fixed. For larger sized cells such as RAM (random access memory) cells, this limitation is of greater concern, because of the relatively fewer number of such cells. It is therefore beneficial to make these larger sized cells as generic as possible to increase their utility for different design needs.

With respect to RAM cells, different applications entail different RAM configurations, e.g., eight-bit word access, sixteen-bit word access, serial (one-bit) access, etc. For this reason, many gate arrays and standard cell libraries include cells of each type to serve all applications. Unfortunately, the unused configurations in a gate array constitute wasted IC area that could be utilized for other needed logic cells.

In the prior art, dual port RAM circuits have been used to increase the utility of the RAM. Examples of dual port RAM for use in video systems are U.S. Pat. Nos. 4,633,441; 4,799,053; and 5,195,056 to Ishimoto, Van Aken et al., and Pinkham et al., respectively. A dual port RAM circuit has two data ports for accessing the contents of the RAM.

In a dual port RAM, the ports may have the same or different data widths. For instance, a dual port RAM may have a first port providing eight-bit access and a second port providing one-bit or serial access to the same memory. This configuration is useful for applications requiring both byte access and serial access, such as for parallel-to-serial and serial-to-parallel conversion. However, other applications may require different configurations. For example, in a video application, a designer may require a first port providing thirty-two-bit access to write pixel data and a second port providing eight-bit access for reading out eight-bit segments of pixel RGB data. In the prior art, the eight-bit/one-bit dual port RAM cell cannot be used in the thirty-two-bit/eight-bit configuration needed in the video application.

Dual port RAM cells provide an improvement in the manner in which memory is accessed. However, designers are limited to the fixed-width configuration available in the hardwired circuit, or else an application specific circuit must be designed to provide the needed configuration. Further, it is inefficient in the standard cell and gate array environments to provide for dual port RAM cells of each possible dual port combination.

SUMMARY OF THE INVENTION

The present invention is a RAM with programmable data port configuration. Whereas prior art RAM cells or arrays have hardwired data ports of fixed sizes, the invention provides for programmable configuration of RAM data ports, and in the case of a multiport RAM, for independent programmable configuration of each data port. A single programmable RAM cell can be utilized in a variety of data port configurations, reducing the number of combinations necessary in a standard cell library or gate array to implement every possible configuration.

In one embodiment of the invention, a dual port RAM is provided with a decoder, an input multiplexer and an output multiplexer for each data port. The input multiplexer for each data port provides several different selectable mappings of a RAM input word of varying sizes to the input bit lines of the respective data port. Similarly, the output multiplexer for each data port provides several different selectable mappings of the RAM output bit lines to the RAM output word. The decoder receives configuration programming bits to determine the appropriate size of the RAM input and output word for the respective port, and based on column addressing bits, outputs a select signal to select the appropriate mapping from the input and output multiplexers. Further decoding circuitry is used during RAM write operations to disable those input bits not addressed.

BRIEF DESCRIPTION OF THE DRAWINGS

FIG. 5 is a diagram of an 8×4 RAM structure illustrating addressing for several configurations.

DETAILED DESCRIPTION OF THE INVENTION

A RAM with programmable data port configuration is described. In the following description, numerous specific details are set forth to provide a more thorough description of the present invention. It will be apparent, however, to one skilled in the art, that the present invention may be practiced without these specific details. In other instances, well known features have not been described in detail so as not to obscure the present invention.

In an embodiment of the invention, a RAM structure, or cell, is provided with one or more data ports having a programmably configurable data width. Whereas RAM structures of the prior art are limited to a hardwired data width, precluding the use of the same structure or design for applications of different data widths, the invention provides for a single RAM structure to be utilized in a plurality of programmable data width configurations. In a multiport embodiment of the invention, each data port is independently configurable providing for broad use of the RAM design in many different applications. Standard cell and gate array environments are able to provide a single programmable RAM cell design where, in the prior art, many fixed data width RAM cells were required.

Figure 1:
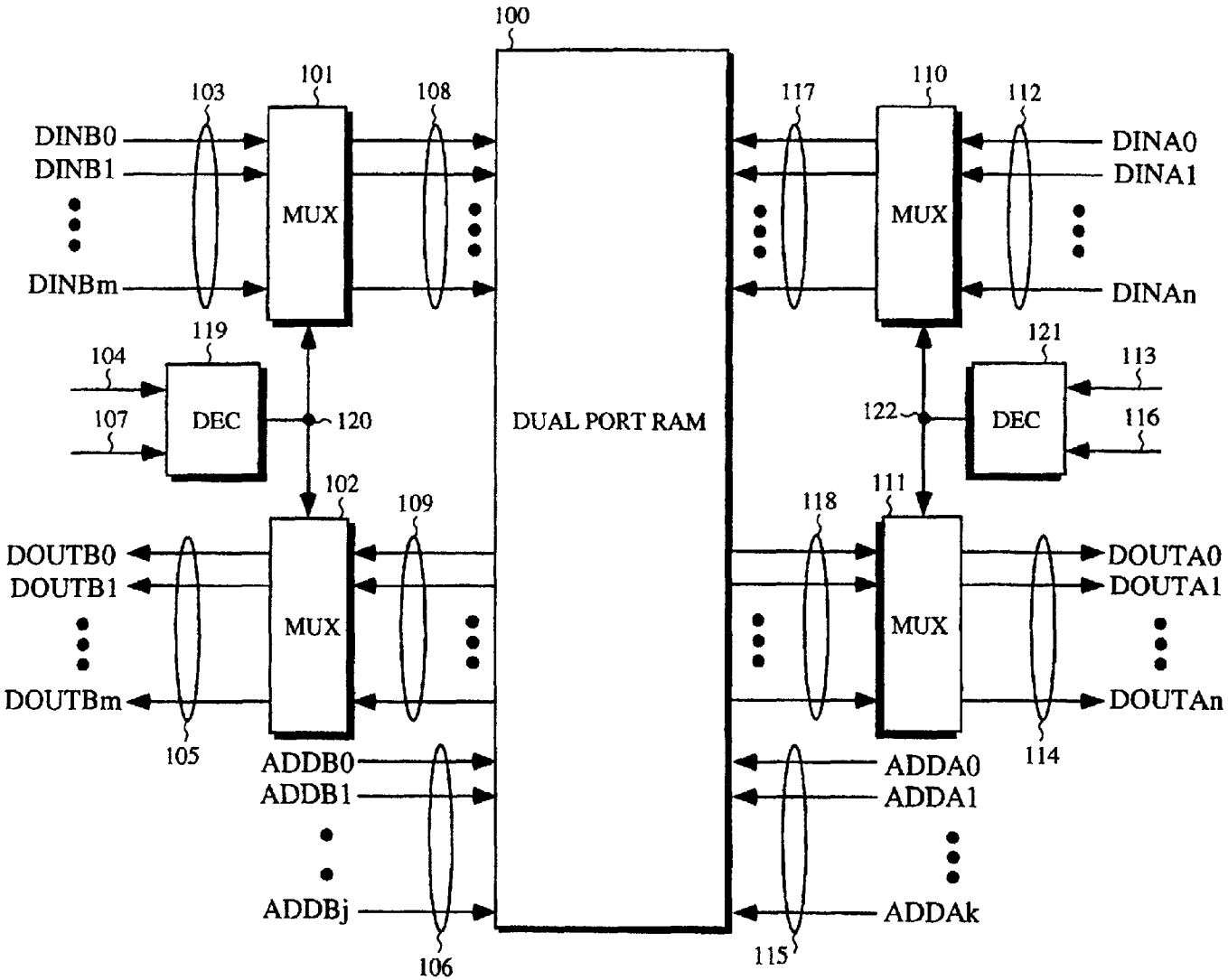
FIG. 1 is a block diagram of a dual port RAM with programmable data port configuration according to an embodiment of the invention.

FIG. 1 is a top level block diagram of a dual port RAM structure having programmably configurable data ports. In FIG. 1, dual port RAM 100 comprises a first input/output (I/O) data port having input bus 108, output bus 109 and address bus 106; and a second I/O data port having input bus 117, output bus 118 and address bus 115. In some embodiments of the invention, however, one or more data ports may be read-only or write-only, comprising only an input multiplexer or an output multiplexer.

Port B input multiplexer 101 is coupled to input bus 108 and external input bus 103. Port B output multiplexer 102 is coupled to output bus 109 and external output bus 105. In addition, input multiplexer 101 and output multiplexer 102 receive select signal 120 from decoder 119. Decoder 119 receives low order address bits 104 and configuration bits 107.

Port A input multiplexer 110 is coupled to input bus 117 and external input bus 112. Port A output multiplexer 111 is coupled to output bus 118 and external output bus 114. In addition, input multiplexer 110 and output multiplexer 111 receive select signal 122 from decoder 121. Decoder 121 receives lower order address bits 113 and configuration bits 116.

Buses 108, 109, 117 and 118 have a fixed width according to the hardwired physical characteristics of dual port RAM 100. Address bus 106 comprises address bit lines ADDB0, ADDB1, . . . ADDBj, which are sufficient to provide unique addresses for memory words in dual port RAM 100 of the width provided by buses 108 and 109. Address bus 115 contains address bit lines ADDA0, ADDA1, . . . ADDAk, which are sufficient to address memory words in dual port RAM 100 having a width corresponding to buses 117 and 118.

External input bus 103 contains data input lines DINB0, DINB1, . . . DINBm, to form a bus width of the same size as bus 108 or smaller. Similarly external input bus 112 contains input lines DINA0, DINA1, . . . DINAn, to provide a bus having a width corresponding to the width of bus 117 or smaller. External output bus 105 consists of bit lines DOUTB0, DOUTB1, . . . DOUTBm, to form a bus having a width having of the same size as bus 109 or smaller. Similarly, external output bus 114 consists of output bit lines DOUTA0, DOUTA1, . . . DOUTAn, to form a bus width of the same size as bus 118 or smaller.

Typically, the configurable external bus width has a maximum value of the fixed internal bus width. Other possible programmable configurations are typically equal to the maximum bus width divided by a power of two. For example, if the internal fixed bus width is sixteen bits, common programmable external configurations are sixteen bits, eight bits, four bits, two bits and one bit. However, other configurations are also possible (e.g., twenty-four internal bits configured to twenty-four, eight, four or one external bits).

Configuration bits 107 are provided on control lines for selecting between possible port configurations. For example, two configuration bits can be used to provide four different port configurations, such as for one bit, two bit, four bit and eight bit wide configurations. Three configuration bits are sufficient to support eight different configurations, etc. Similarly, configuration bits 116 are provided on control lines for port A. Lower order address bits 104 provide for selection of data bit subsets from buses 108 and 109. Similarly, lower order address bits 113 provide for selection of data bit subsets from buses 117 and 118. The number of lower address bits is at least equal to $\log_2$ of the internal fixed bus width divided by the minimum external bus width.

Multiplexers 101, 102, 110 and 111 provide for mapping of the bit lines between the external buses and the respective internal buses to implement the desired configurations. Decoders 119 and 122 independently select the appropriate mapping from their associated multiplexers based on the respective port configuration bits, and the lower order (or column) address bits when applicable.

The configuration bits may be stored in an external memory circuit such as an EPROM, or the configuration bits may be stored in a local register. Further, the configuration bits may be set once at startup, or they may be set and reset during circuit operation to provide the utility of the different configurations while the circuit is operating. The independent programmability of each port provides a versatility advantage over memory circuits of the prior art.

FIG. 5 illustrates an addressing scheme for an eight by four RAM cell. The RAM contains eight rows (0-7) of memory words having four memory bits, B0 through B3. Row address bits $A_1$, $A_2$ and $A_3$ are used to specify one row from the eight possible rows within the RAM. $A_1$ is the most significant row address bit, and $A_3$ is the least significant row address bit. Column address bits CA0 and CA1 are used to specify particular columns of the RAM. CA0 is the most significant column address bit, and is used to separate the RAM into a least significant two-bit column comprising bits B0 and B1, and a most significant two-bit column comprising bits B2 and B3. CA1 is used to specify a single bit column within each two-bit column specified by CA0. Further column address bits are used to further subdivide larger RAM configurations.

TABLE 1

GENERAL MAPPING TABLE (×4, ×2, ×1)

| MEM1 | MEM2 | CA0 | CA1 | D0 | D1 | D2 | D3 |
|---|---|---|---|---|---|---|---|
| 0 | 0 | X | X | B0 | B1 | B2 | B3 |
| 0 | 1 | 0 | X | B0 | B1 | X | X |
| 0 | 1 | 1 | X | B2 | B3 | X | X |
| 1 | 0 | X | X | X | X | X | X |
| 1 | 1 | 0 | 0 | B0 | X | X | X |
| 1 | 1 | 0 | 1 | B1 | X | X | X |
| 1 | 1 | 1 | 0 | B2 | X | X | X |
| 1 | 1 | 1 | 1 | B3 | X | X | X |

(X = Don't care conditions)

Table 1 is a mapping diagram for a four-bit internal RAM port with programmable configurations for four-bit wide access (×4), two-bit wide access (×2), and one-bit wide or serial access (×1). D0-D3 represent the bit lines of the external port (input and output) of the programmable RAM. B0-B3 represent the fixed internal bit lines (input and output) of the programmable RAM. MEM1 and MEM2 are the configuration bit values, and CA0 and CA1 are the low order (or column) address bit values for the configurations which require finer addressing.

Table 1 contains many "don't care" conditions that allow for variations in the implementation of the data port. In general, multiplexers are used to provide the selectable paths by which the internal and external bit lines are coupled. A decoder is used to control the multiplexers based on the inputs MEM1, MEM2, CA0 and CA1, such that the definitions of Table 1 are implemented.

TABLE 2

MAPPING TABLE FOR EMBODIMENT OF FIG. 2

| MEM1 | MEM2 | CA0 | CA1 | D0 | D1 | D2 | D3 | |
|---|---|---|---|---|---|---|---|---|
| 0 | 0 | X | X | B0 | B1 | B2 | B3 | S0 |
| 0 | 1 | 0 | X | B0 | B1 | B2 | B3 | S0 |
| 0 | 1 | 1 | X | B2 | B3 | B0 | B1 | S2 |
| 1 | 0 | X | X | X | X | X | X | — |
| 1 | 1 | 0 | 0 | B0 | B1 | B2 | B3 | S0 |
| 1 | 1 | 0 | 1 | B1 | B2 | B3 | B0 | S1 |
| 1 | 1 | 1 | 0 | B2 | B3 | B0 | B1 | S2 |
| 1 | 1 | 1 | 1 | B3 | B0 | B1 | B2 | S3 |

Table 2 is an embodiment of Table 1 wherein the "don't care" conditions have been filled in to provide for assignment of the general bit mappings of Table 1 to four particular bit mappings for one embodiment of the programmable four-bit data port. The four particular bit mappings are labelled as S0-S3, and correspond to particular select signals output from a decoder in the implementation shown in FIG. 2.

Figure 2:
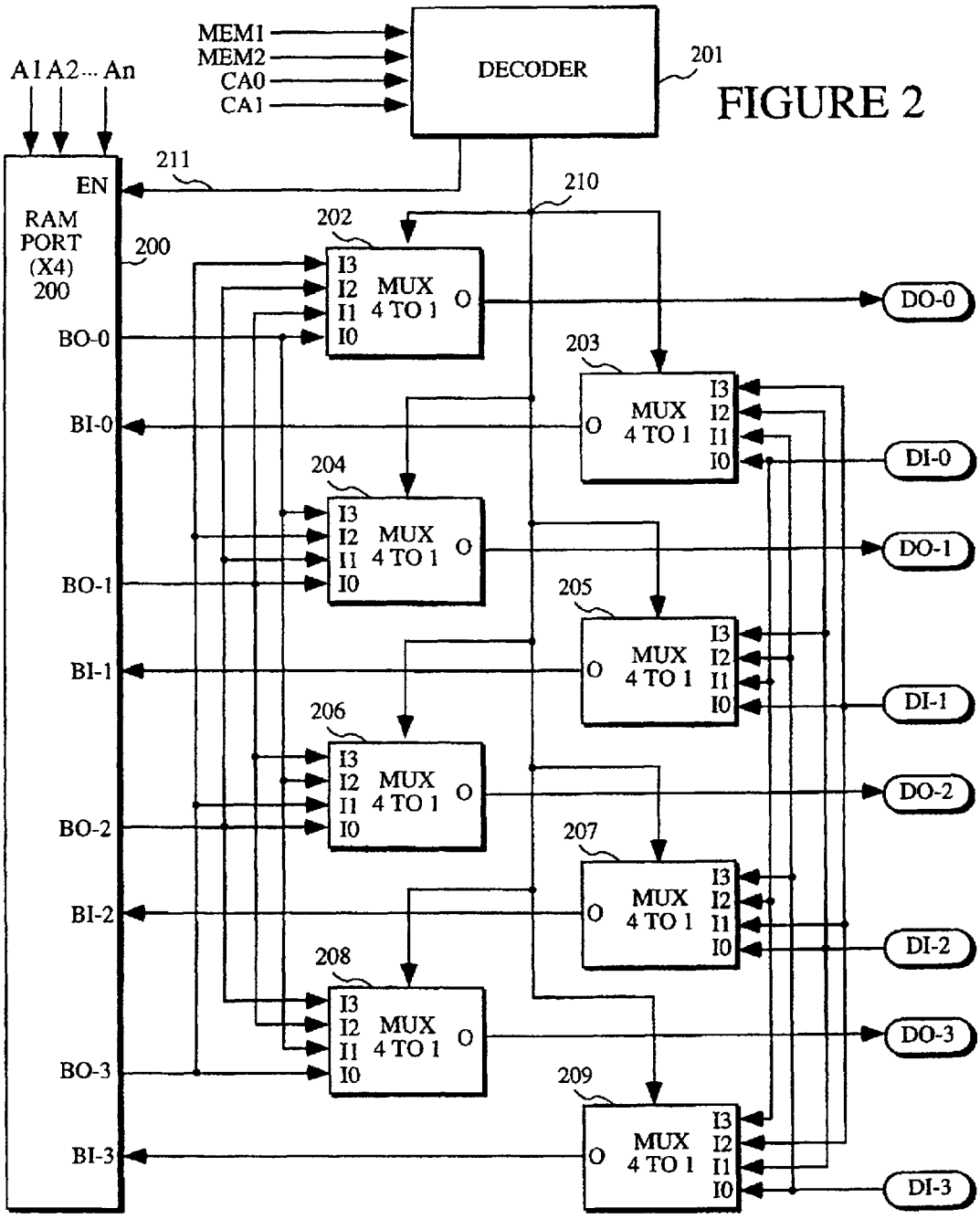
FIG. 2 is a block diagram of a single programmable data port according to an embodiment of the invention.

FIG. 2 is a bit level block diagram of an embodiment for one port of a RAM device having programmable configuration capabilities as defined in Table 2. In the embodiment of FIG. 2, the hardwired width of RAM port 200 is four bits wide. Address lines A1, A2, . . . An are provided to RAM port 200 to address the four bit words from the RAM device. Multiplexers (MUXs) 202, 204, 206 and 208 are used to map the four bits of the output word comprising bits BO-0, BO-1, BO-2, and BO-3 to the external output word comprising bits DO-0, DO-1, DO-2 and DO-3. Multiplexers 203, 204, 207 and 209 are used to map the four bits of the external word comprising DI-0, DI-1, DI-2 and DI-3 to the RAM port input word comprising bits BI-0, BI-1, BI-2 and BI-3.

Each bit level multiplexer has four inputs, I0-I3, and one output, O. Select signal 210 is provided to each multiplexer (202-209) to select from the four inputs (I0-I3) the appropriate signal to pass to the output (O). The composition of select signal 210 is determined by what is appropriate to drive the selected implementation of multiplexers 202-209. In this embodiment, the selection of MUX input I0 from each multiplexer corresponds to decode selection S0, the selection of all I1 inputs corresponds to selection S1, etc. Input multiplexers 203, 205, 207, and 209 provide the RAM port input signals BI-0, BI-1, BI-2 and BI-3, respectively. Output multiplexers 202, 204, 206 and 208 provide output signals DO-0, DO-1, DO-2 and DO-3, respectively.

RAM port output signal BO-0 is coupled to input I0 of MUX 202, input I3 of MUX 204, input I2 of MUX 206 and input I1 of MUX 208. RAM port output signal BO-1 is coupled to input I1 of MUX 202, input I0 of MUX 204, input I3 of MUX 206 and input I2 of MUX 208. RAM port output signal BO-2 is coupled to input I2 of MUX 202, input I1 of MUX 204, input I0 of MUX 206 and input I3 of MUX 208. RAM port output signal BO-3 is coupled to input I3 of MUX 202, input I2 of MUX 204, input I1 of MUX 206 and input I0 of MUX 208.

External input signal DI-0 is coupled to input I0 of MUX 203, input I1 of MUX 205, input I2 of MUX 207 and input I3 of MUX 209. External input signal DI-1 is coupled to input I3 of MUX 203, input I0 of MUX 205, input I1 of MUX 207 and input I2 of MUX 209. External input DI-2 is coupled to input I2 of MUX 203, input I3 of MUX 205, input I0 of MUX 207 and input I1 of MUX 209. External input DI-3 is coupled to input signal I1 of MUX 203, input I2 of MUX 205, input I3 of MUX 207 and input I0 of MUX 209.

Decoder 201 receives configuration signals MEM1 and MEM2 to select from three possible configurations, i.e., one-bit, two-bit and four-bit wide operations. Lower order address bits CA0 and CA1 are provided to decoder 201 for addressing within the four-bit word for the one-bit wide and two-bit wide configurations. Also, further decoding circuitry acts to disable unselected RAM port input lines during write operations. The enable/disable signals are represented in FIG. 2 by line 211 coupling decoder 201 to RAM port 200.

In general, the embodiment of FIG. 2 operates by steering the data inputs and outputs of the RAM port 200 to different external ports via the multiplexers, depending on the selected configuration of the RAM (MEM1 and MEM2) and the low order address bits (or column address bits) CA0 and CA1. The RAM port 200 is internally configured as four-bit wide data words, but by use of the steering circuitry, the RAM may be accessed as a two-bit wide word or as a single bit for serial purposes. The configuration of the RAM data port in FIG. 2 is controlled by configuration bits MEM1 and MEM2 as follows:

| MEM1 | MEM2 | Configuration |
|---|---|---|
| 1 | 1 | ×1 |
| 0 | 0 | ×4 |
| 0 | 1 | ×2 |
| 1 | 0 | Unused |

For other embodiments, the configuration (MEM1,MEM2)=(1,0) is used to specify a fourth configuration. More configuration bits may be used to increase the number of possible configurations further.

When the RAM configuration bits MEM1 and MEM2 are set to the four-bit wide (×4) configuration, the column address bits CA0 and CA1 are not used in the decoding process because all bits are selected. Decoder 201 selects the I0 input of multiplexers 202-209 via select signal 210. Multiplexers 202, 204, 206 and 208 steer internal output port signals BO-0 through BO-3 to external output ports DO-0 through DO-3, respectively. Multiplexers 203, 205, 207 and 209 steer external input port signals DI-0 through DI-3 to internal input ports BI-0 through BI-3, respectively. Thus, when the four-bit wide configuration is selected, the multiplexers pass the RAM inputs and outputs directly through without remapping.

When the RAM configuration bits are set to the two-bit wide (×2) configuration, column address bit CA0 is used to select from the two two-bit words at each row address. Address bit CA1 is unused. Decoder 201 selects mapping S0, or all I0 inputs, when CA0 is "0" to couple the two least significant bits (B0, B1) of the internal buses to the two least significant bits (D0, D1) of the external buses. Similarly, decoder 201 selects mapping S2, or all I2 inputs, when CA0 is "1" to couple the two most significant bits (B2, B3) of the internal buses to the two least significant bits of the external bus (D0, D1). Only the two lease significant bits are used to access the RAM in the (×2) configuration of this implementation. Alternatively, two other bits of the external bus may be used to access the selected two bits from the internal bus.

When the RAM configuration bits are set to the one-bit wide (×1) or serial configuration, column address bits CA0 and CA1 are used to address the individual bits in the four-bit word selected by address A0-An. Only one bit line on the external buses is used to access data. In this embodiment, the access line is the least significant external bit line. When (CA0, CA1) is (0,0), decoder 201 selects mapping S0, or all I0 inputs, to couple the least significant internal bit line (B0) to the least significant external bit line (D0). When (CA0, CA1) is (0,1), decoder 201 selects mapping S1, or all I1 inputs, to couple the second least significant internal bit line (B1) to the least significant external bit line (D0). When (CA0,CA1) is (1,0), decoder 201 selects mapping S2, or all I2 inputs, to couple the second most significant internal bit line (B2) to the least significant external bit line (D0). Finally, when (CA0,CA1) is (1,1), decoder 201 selects mapping S3, or all I3 inputs, to couple the most significant internal bit line (B3) to the least significant external bit line (D0). Thus, each bit of the four-bit internal word is addressable.

The embodiment of FIG. 2 is easily expanded for larger internal words and more possible configurations. It will also be obvious to one skilled in the art that multiplexer/decoder embodiments can be used to implement the mappings of Table 1. For example, at the cost of modifying the decoder, another embodiment may comprise a four to one multiplexer for coupling internal bit lines to external bit line D0, a two to one multiplexer for coupling only internal bit lines B1 and B3 to external bit line D1, and direct connections for coupling internal bit line B2 to external bit line D2 and internal bit line B3 to external bit line D3.

Figure 3:
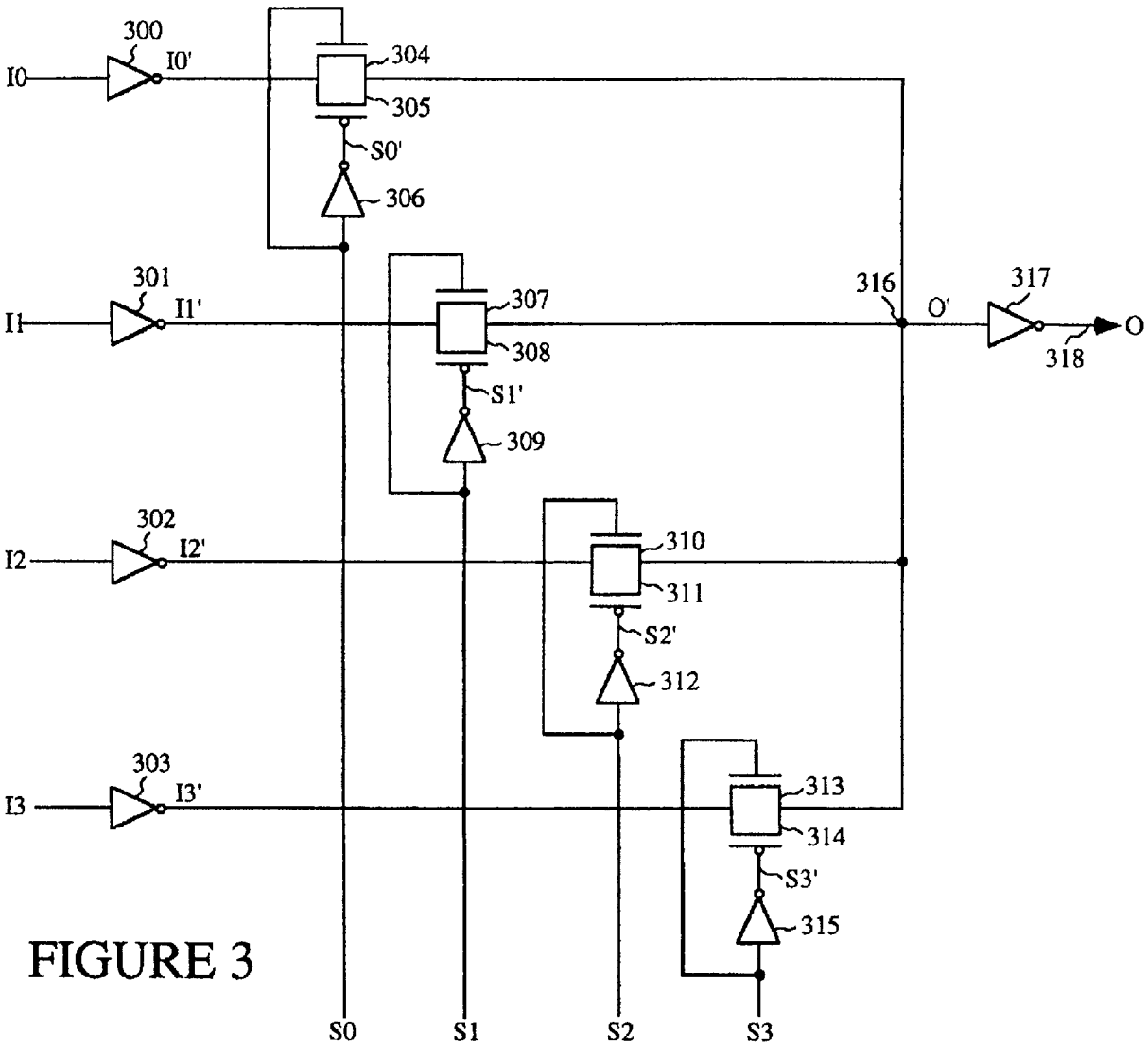
FIG. 3 is a circuit diagram of a four-to-one multiplexer suitable for the embodiment of FIG. 2.

FIG. 3 is a circuit diagram of one embodiment of a four to one multiplexer suitable for use in the circuit of FIG. 2. Input signals I0, I1, I2 and I3 are provided to inverters 300, 301, 302 and 303, respectively. I0', the output of inverter 300, is provided to the transmission gate formed by NMOS transistor 304 and parallel with PMOS transistor 305. I1', the output of inverter 301, is provided to the transmission gate formed by NMOS 307 in parallel with PMOS transistor 308. I2', the output of inverter 302, is provided to the transmission gate formed by NMOS transistor 310 and parallel with PMOS 311. I3', the output of inverter 303, is provided to the transmission gate formed by NMOS transistor 313 in parallel with PMOS 314. The output line of the transmission gates are joined at node 316 (O'), which in turn is coupled to the input terminal of inverter 317. The inverter 317 provides signal 318 (O).

Select signal S0 is provided to the gate of NMOS transistor 304, and through inverter 306 to the gate of PMOS transistor 305. Select signal S1 is provided to the gate NMOS transistor 307 and through inverter 309 to the gate of PMOS transistor 308. Select signal S2 is provided to the gate of NMOS transistor 310 and through inverter 312 to the gate of PMOS transistor 311. Select signal S3 is provided to the gate of NMOS transistor 313 and through inverter 315 to the gate of PMOS transistor 314.

The transmission gates formed by the complimentary NMOS and PMOS transistors provide a closed circuit when the associated select signal is asserted. When the associated select signal is not asserted, the transmission gate provides an open circuit. By asserting only one select signal at any moment in time, multiplexing of the four input values to a single output value is achieved. Inverters 300-303 and 317 provide buffering for the transmission function, but are unnecessary when the transmission gates are formed from logic having built-in sourcing and sinking capabilities.

Figure 4:
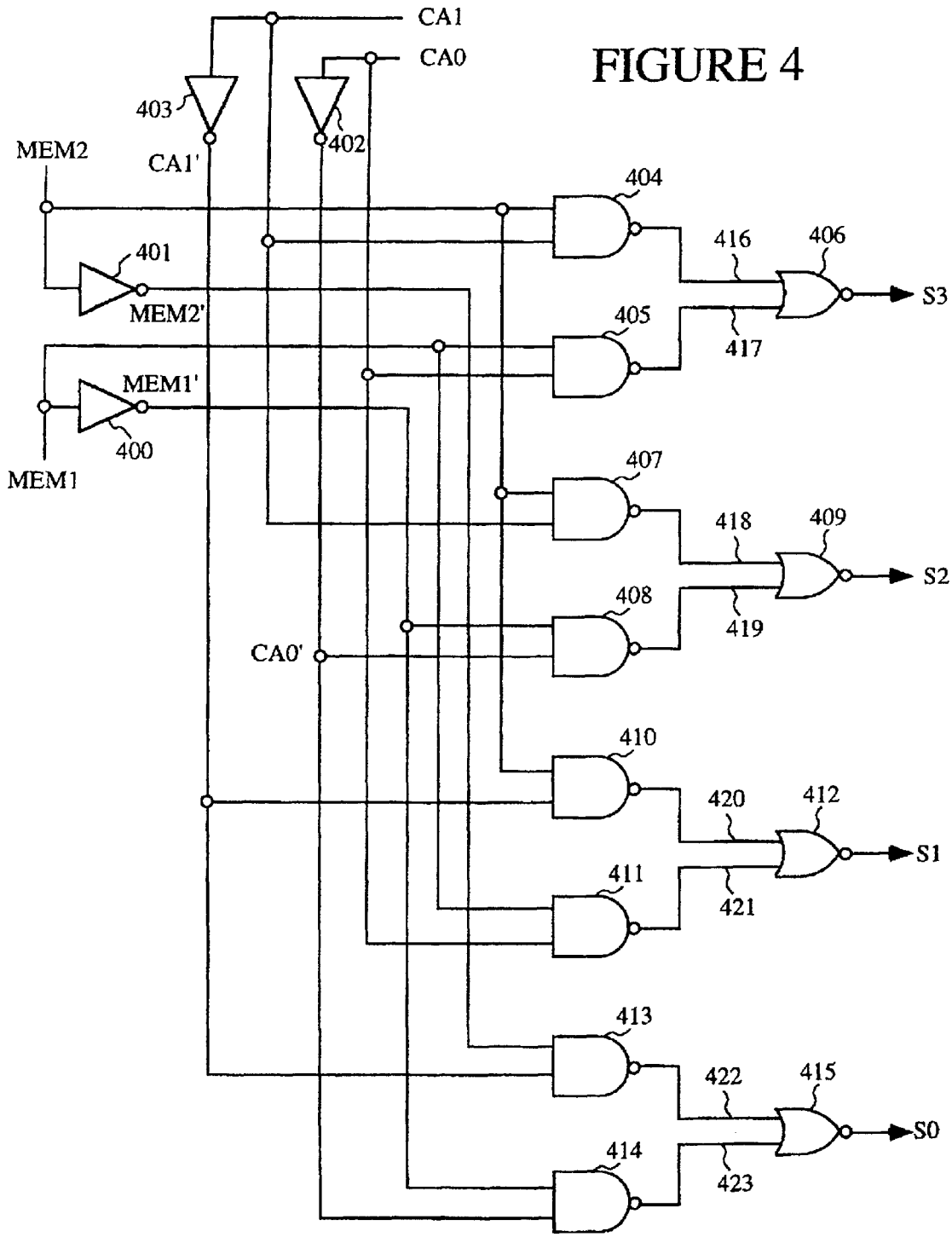
FIG. 4 is logic diagram of a selection decoder suitable for the embodiment of FIG. 2.

FIG. 4 is a logic level diagram of one embodiment of a decoder for the example of FIG. 2. The decoding function provided is defined by Table 2, with select signals S0-S3 corresponding to bit mappings S0-S3. In FIG. 4, configuration signals MEM1 and MEM2 are coupled to inverters 400 and 401 respectively to provide signals MEM1' and MEM2'. Similarly, lower order address bits CA0 and CA1 are provided to inverters 402 and 403, respectively, to provide signals CA0' and CA1'.

NAND gates 404 and 405 and NOR gate 406 provide decoding of the input signals to generate select signal S3. NAND gate 404 receives as input signals MEM2 and CA1. NAND gate 405 receives as input signals MEM1 and CA0. Output signal 416 from NAND gate 404 and output signal 417 from NAND gate 405 are provided as input signals to NOR gate 406. The output signal of NOR gate 406 is select signal S3.

NAND gate 407 and NOR gates 408 and 409 provide decoding of the input signals to generate select signal S2. NAND gate receives as input signals MEM2 and CA1. NOR gate 408 receives as signals MEM1' and CA0'. Output signal 418 from NAND gate 407 and output signal 419 from NOR gate 408 are provided as input signals to NOR gate 409. The output signal of NOR gate 409 is select signal S2.

NAND gates 410 and 411 and NOR gate 412 provide decoding of the input signals to generate select signal S1. NAND gate 410 receives as input signals MEM2 and CA1'. NAND gate 411 receives as input signals MEM1 and CA0. Output signal 420 from NAND gate 410 and output signal 421 from NAND gate 411 are provided as input signals to NOR gate 412. The output signal of NOR gate 412 is select signal S1.

NOR gates 413, 414 and 415 provide decoding of the input signals to generate select signal S0. NOR gate 413 receives as input signals MEM2' and CA1'. NOR gate 414 receives as input signals MEM1' and CA0'. Output signal 422 from NOR gate 413 and output signal 423 from NOR gate 414 are provided as input signals to NOR gate 415. The output signal of NOR gate 415 is select signal S0.

TABLE 3

| WRITE ENABLE CONTROLS | | | | | | | |
|---|---|---|---|---|---|---|---|
| MEM1 | MEM2 | CA0 | CA1 | BI-0/EN | BI-1/EN | BI-2/EN | BI-3/EN |
| 0 | 0 | X | X | 1 | 1 | 1 | 1 |
| 0 | 1 | 0 | X | 1 | 1 | 0 | 0 |
| 0 | 1 | 1 | X | 0 | 0 | 1 | 1 |
| 1 | 0 | X | X | 0 | 0 | 0 | 0 |
| 1 | 1 | 0 | 0 | 1 | 0 | 0 | 0 |
| 1 | 1 | 0 | 1 | 0 | 1 | 0 | 0 |
| 1 | 1 | 1 | 0 | 0 | 0 | 1 | 0 |
| 1 | 1 | 1 | 1 | 0 | 0 | 0 | 1 |

(X = Don't care conditions)

For configurations in which a writing operation writes information to only a portion of the internal data word, the unselected portion of the internal data word is disabled to prevent the undesired writing over of underlying data. For this purpose, the RAM may be designed with individual "write enable" control of the internal bit lines or of the smallest selectable unit of the internal word. A decoding operation similar to that outlined in FIG. 4 is used to enable and disable the internal bit lines as necessary. Table 3 defines the enabling of bit lines BI-0 through BI-3 to correspond to the selection definitions of Table 1.

The contents of Table 3 can be reduced to the following Boolean equations:

$$\text{BI-0/EN}=(\text{MEM1}'\ \text{MEM2}')+(\text{CA0}'\ \text{MEM1}')+(\text{MEM2}\ \text{CA0}'\ \text{CA1}')$$

$$\text{BI-1/EN}=(\text{MEM1}'\ \text{MEM2}')+(\text{CA0}'\ \text{MEM1}')+(\text{MEM2}\ \text{CA0}'\ \text{CA1})$$

$$\text{BI-2/EN}=(\text{MEM1}'\ \text{MEM2}')+(\text{CA0}\ \text{MEM1}')+(\text{MEM2}\ \text{CA0}\ \text{CA1}')$$

$$\text{BI-3/EN}=(\text{MEM1}'\ \text{MEM2}')+(\text{CA0}\ \text{MEM1}')+(\text{MEM2}\ \text{CA0}\ \text{CA1})$$

Combinational logic for implementing the above decoding equations enables each bit line on the internal RAM input bus as appropriate based on the combination of signals MEM1, MEM2, CA0 and CA1. A similar derivation is performed to provide enabling/disabling write circuitry for other embodiments.

Thus, a multiport RAM with programmable data port configuration has been described.

We claim:

1. A circuit for programmably configuring a data port having a fixed word length M, comprising:

a multiplexer circuit coupled to a data port, said multiplexer circuit having a selectable electronic mapping between said data port and a second port of programmable word-length N where N is less than or equal to M, said multiplexer circuit responsive to a select signal; and a decoder having a configuration input and an address input, said decoder generating said select signal.

2. The circuit *for programmably configuring a data port* of claim 1 wherein M divided by N is a multiple of two.

3. The circuit *for programmably configuring a data port* of claim 1 wherein said programmable word-length N is dependent on said configuration input.

4. The circuit *for programmably configuring a data port* of claim 3 wherein said configuration input is received from a register having configuration bits stored therein.

5. The circuit *for programmably configuring a data port* of claim 3 wherein said configuration input is received from a ROM having configuration bits stored therein.

6. The circuit *for programmably configuring a data port* of claim 1 wherein said decoder selects an N-bit word from said M-bit data port based on said address input.

7. The circuit *for programmably configuring a data port* of claim 1 wherein said multiplexer circuit comprises:

an input multiplexer coupled to said data port and said select signal, said input multiplexer selectably configured to map input data words of word-length N from said second port into said data port; and an output multiplexer coupled to said data port and said select signal, said output multiplexer selectably configured to map output data words of word-length M from said data port into said second port.

8. The circuit *for programmably configuring a data port* of claim 1 wherein said data port is part of a memory circuit, and wherein said decoder further comprises:

a decoding circuit coupled to said data port, wherein said decoding circuit is configured to selectively disable a write operation for a portion of said data port based on said configuration input and said address input.

9. A multiport RAM with programmable data port configuration, comprising:

a first internal data port of fixed width M;

a second internal data port of fixed width N;

a first multiplexer circuit coupled to said first internal data port, said first multiplexer circuit having a selectable electronic mapping between said first internal data port and a first external data port of programmable width X where X is less than or equal to M, said first multiplexer circuit responsive to a first select signal;

a second multiplexer circuit coupled to said second internal data port, said second multiplexer circuit having a selectable electronic mapping between said second internal data port and a second external data port of programmable width Y where Y is less than or equal to N, said second multiplexer circuit responsive to a second select signal;

a first decoder having a first configuration input and a first address input, said first decoder generating said first select signal; and a second decoder having a second configuration input and a second address input, said second decoder generating said second select signal.

10. The [circuit] *multiport RAM* of claim 9 wherein M divided by X is a multiple of two.

11. The [circuit] *multiport RAM* of claim 9 wherein said programmable width X is dependent on said first configuration input, and said programmable width Y is dependent on said second configuration input.

12. The [circuit] *multiport RAM* of claim 11 wherein said first configuration input and said second configuration input are received from at least one register having configuration bits stored therein.

13. The [circuit] *multiport RAM* of claim 11 wherein said first configuration input and said second configuration input are received from a ROM having configuration bits stored therein.

14. The [circuit] *multiport RAM* of claim 9 wherein said first decoder selects an X-bit word from said first internal data port based on said first address input, and said second decoder selects a Y-bit word from said second internal data port based on said second address input.

15. The [circuit] *multiport RAM* of claim 9 wherein said first multiplexer circuit comprises:

an input multiplexer coupled to said first internal data port and said first select signal, said input multiplexer selectably configured to map input data words of width X from said first external data port into said first internal data port; and an output multiplexer coupled to said first internal data port and said first select signal, said output multiplexer selectably configured to map output data words of width M from said first internal data port into said first external data port.

16. The [circuit] *multiport RAM* of claim 9 wherein said second multiplexer circuit comprises:

an input multiplexer coupled to said second internal data port and said second select signal, said input multiplexer selectably configured to map input data words of width Y from said second external data port into said second internal data port; and an output multiplexer coupled to said second internal data port and said second select signal, said output multiplexer selectably configured to map output data words of width N from said second internal data port into said second external data port.

17. The [circuit] *multiport RAM* of claim 9 wherein each of said first and second decoders further comprise:

a decoding circuit coupled to a respective internal data port, wherein said decoding circuit is configured to selectively disable a write operation for a portion of said respective internal data port based on a respective configuration input and a respective address input.

18. The [circuit] *multiport RAM* of claim 9 wherein X and Y are independently programmable.

* * * * *